US009181920B2

(12) United States Patent
Burrows

(10) Patent No.: US 9,181,920 B2
(45) Date of Patent: Nov. 10, 2015

(54) SYSTEM AND METHOD FOR DETECTING ARC FORMATION IN A CORONA DISCHARGE IGNITION SYSTEM

(75) Inventor: John Antony Burrows, Northwich (GB)

(73) Assignee: Federal-Mogul Ignition Company, Southfield, MI (US)

( * ) Notice: Subject to any disclaimer, the term of this patent is extended or adjusted under 35 U.S.C. 154(b) by 451 days.

(21) Appl. No.: 13/438,116

(22) Filed: Apr. 3, 2012

(65) Prior Publication Data

US 2012/0249163 A1 Oct. 4, 2012

Related U.S. Application Data

(60) Provisional application No. 61/471,448, filed on Apr. 4, 2011, provisional application No. 61/471,452, filed on Apr. 4, 2011.

(51) Int. Cl.

| | |
|---|---|
| ***G01R 27/04*** | (2006.01) |
| ***F02P 23/04*** | (2006.01) |
| *F02D 41/28* | (2006.01) |
| *F02P 17/12* | (2006.01) |

(52) U.S. Cl.

CPC ........... *F02P 23/04* (2013.01); *F02D 2041/288* (2013.01); *F02P 17/12* (2013.01)

(58) Field of Classification Search

CPC ...... F02P 23/04; F02P 17/12; F02D 2041/288

USPC ................. 324/633, 600, 647, 455, 536, 678, 324/76.32, 76.11, 500; 315/209

See application file for complete search history.

(56) References Cited

U.S. PATENT DOCUMENTS

| | | | |
|---|---|---|---|
| 5,568,801 A | 10/1996 | Paterson et al. | |
| 5,845,488 A * | 12/1998 | Hancock et al. | 60/275 |
| 6,085,733 A | 7/2000 | Motoyama et al. | |
| 6,883,507 B2 | 4/2005 | Freen | |
| 2010/0005870 A1 | 1/2010 | Bachmaier et al. | |
| 2010/0055455 A1 | 3/2010 | Dauer | |
| 2010/0116257 A1 | 5/2010 | Agneray et al. | |

(Continued)

FOREIGN PATENT DOCUMENTS

| | | |
|---|---|---|
| CN | 101663481 A | 3/2010 |
| DE | 102005036968 A1 | 2/2007 |
| DE | 102010062304 A1 | 6/2012 |
| FR | 2 859 831 A1 | 9/2012 |
| WO | 2007017481 A1 | 2/2007 |
| WO | 2010011838 A1 | 1/2010 |

OTHER PUBLICATIONS

International Search Report PCT/US2012/032034 mailed on Sep. 6, 2012.

*Primary Examiner* — Melissa Koval
*Assistant Examiner* — Trung Nguyen
(74) *Attorney, Agent, or Firm* — Robert L. Stearns; Dickinson Wright, PLLC

(57) ABSTRACT

A system and method for detecting arc formation in a corona discharge ignition system is provided. The system includes a driver circuit conveying energy oscillating at a resonant frequency; a corona igniter for receiving the energy and providing a corona discharge; and a frequency monitor for identifying a variation in an oscillation period of the resonant frequency, wherein the variation in the oscillation period indicates the onset of arc formation. The method includes supplying the energy to the driver circuit and to the corona igniter; obtaining the resonant frequency of the energy in the oscillating driver circuit; and identifying a variation in the oscillation period of the resonant frequency.

18 Claims, 3 Drawing Sheets

(56) References Cited

U.S. PATENT DOCUMENTS

| | | | | |
|---|---|---|---|---|
| 2010/0251995 | A1 | 10/2010 | Nouvel et al. | |
| 2010/0282198 | A1 | 11/2010 | Hampton et al. | |
| 2011/0114071 | A1 | 5/2011 | Freen | |
| 2011/0197865 | A1 * | 8/2011 | Hampton | 123/623 |
| 2011/0203543 | A1 | 8/2011 | Agneray et al. | |
| 2011/0297132 | A1 | 12/2011 | Schremmer et al. | |
| 2011/0305998 | A1 | 12/2011 | Toedter et al. | |
| 2012/0048225 | A1 | 3/2012 | Makarov et al. | |
| 2012/0055430 | A1 | 3/2012 | Braeuchle | |

* cited by examiner

SYSTEM AND METHOD FOR DETECTING ARC FORMATION IN A CORONA DISCHARGE IGNITION SYSTEM

CROSS REFERENCE TO RELATED APPLICATION

This application claims the benefit of U.S. provisional application Ser. Nos. 61/471,448 and 61/471,452, both filed Apr. 4, 2011.

BACKGROUND OF THE INVENTION

1. Field of the Invention

This invention relates generally to corona discharge ignition systems, and more particularly to detecting arc formation in the system.

2. Related Art

Corona discharge ignition systems provide an alternating voltage and current, reversing high and low potential electrodes in rapid succession which makes arc formation difficult and enhances the formation of corona discharge. The system includes a corona igniter with a central electrode charged to a high radio frequency voltage potential and creating a strong radio frequency electric field in a combustion chamber. The electric field causes a portion of a mixture of fuel and air in the combustion chamber to ionize and begin dielectric breakdown, facilitating combustion of the fuel-air mixture. The electric field is preferably controlled so that the fuel-air mixture maintains dielectric properties and corona discharge occurs, also referred to as a non-thermal plasma. The ionized portion of the fuel-air mixture forms a flame front which then becomes self-sustaining and combusts the remaining portion of the fuel-air mixture. Preferably, the electric field is controlled so that the fuel-air mixture does not lose all dielectric properties, which would create a thermal plasma and an electric arc between the electrode and grounded cylinder walls, piston, metal shell, or other portion of the igniter. The electric arc, or arcing, can reduce energy efficiency and decrease the robustness of the ignition event of the system. An example of a corona discharge ignition system is disclosed in U.S. Pat. No. 6,883,507 to Freen.

SUMMARY OF THE INVENTION

One aspect of the invention provides a method for detecting an arc formation in a corona discharge ignition system. The method includes supplying energy to a driver circuit oscillating at a resonant frequency and a corona igniter for providing a corona discharge; obtaining a resonant frequency of the energy in the oscillating driver circuit; and identifying a variation in an oscillation period of the resonant frequency.

Another aspect of the invention provides a system employing the method. The system includes a driver circuit conveying energy oscillating at a resonant frequency; a corona igniter for receiving the energy and providing a corona discharge; and a frequency monitor for identifying a variation in an oscillation period of the resonant frequency, wherein the variation in the oscillation period indicates the onset of arc formation.

The system and method provides a quick and cost effective means to detect the onset of arc formation in a corona discharge ignition system. The system does not attempt to prevent the arc formation, but the arc formation is typically unintentional as corona discharge typically provides better energy efficiency and performance.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION

The invention provides a system and method for detecting an arc formation in an ignition system designed to provide a corona discharge 20. The system includes a driver circuit 22 conveying energy and oscillating at a resonant frequency; a corona igniter 24 for receiving the energy and providing the corona discharge 20; and a frequency monitor 26 for identifying a variation in an oscillation period of the resonant frequency, wherein the variation in the oscillation period indicates the onset of arc formation.

Figure 1:
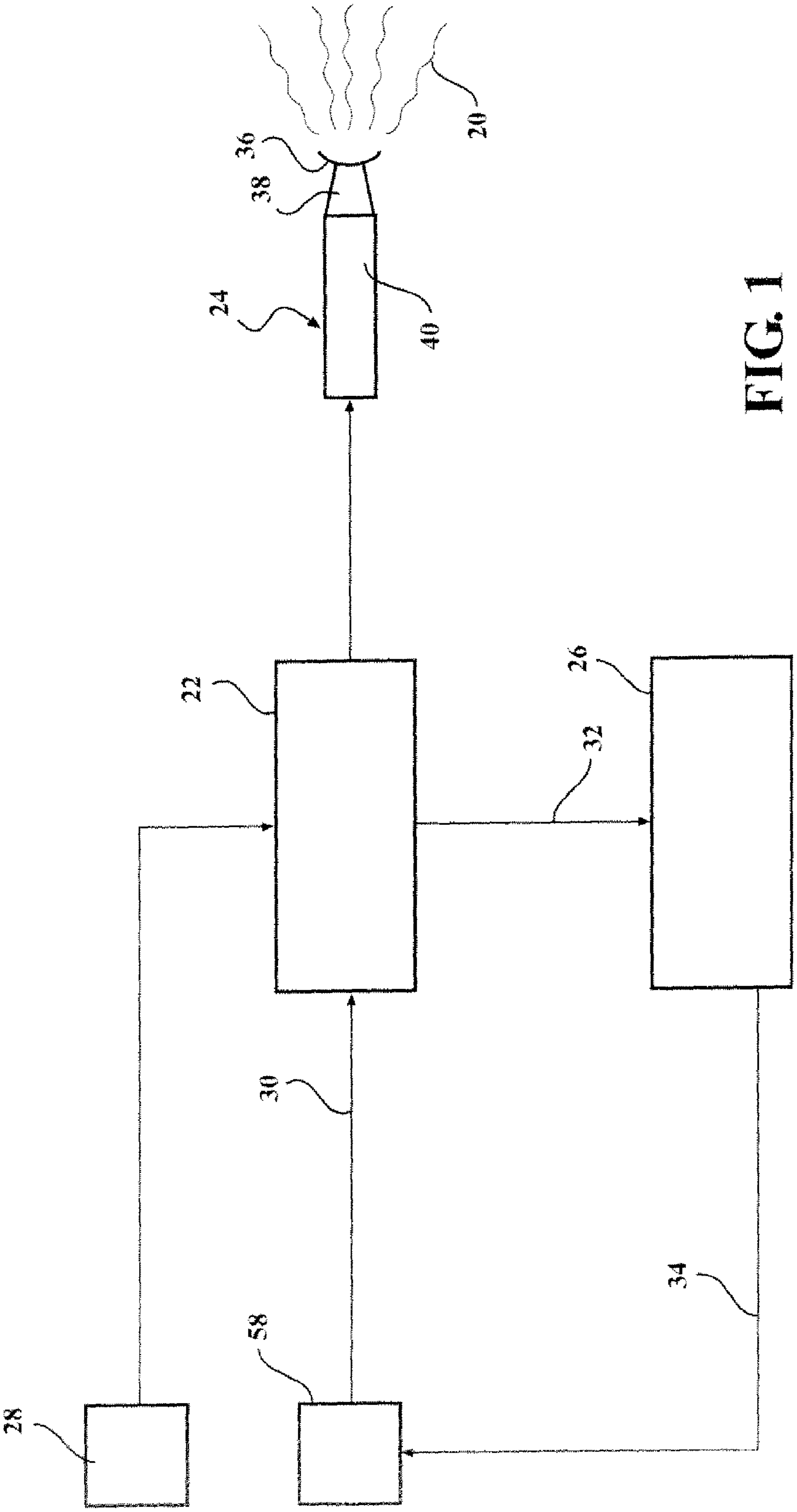
FIG. 1 is a block diagram of a system for detecting an arc formation according to one embodiment of the invention.

The method employed in the system includes supplying energy to the driver circuit 22 and to the corona igniter 24. The method next includes obtaining the resonant frequency of the energy in the oscillating driver circuit 22; and identifying a variation in the oscillation period of the resonant frequency. FIG. 1 is a block diagram showing the main components of the system, including an energy supply 28, an enable signal 30, the driver circuit 22, a frequency signal 32, the corona igniter 24, the frequency monitor 26, and a feedback signal 34.

The system and method provides several advantages over prior art systems used to detect arcing. First, the system and method is low cost as it can use components of an existing corona discharge ignition system, without the need for complex digital components, calibration, or monitoring. Further, the system and method is extremely fast and can detect the onset of the arc formation in a matter of nanoseconds or microseconds. The system and method of the present invention does not need to measure the current directly or determine impedance.

The system is typically employed in an internal combustion engine (not shown). The internal combustion engine typically includes a cylinder head, cylinder block, and piston defining a combustion chamber containing a combustible mixture of fuel and air. The corona igniter 24 is received in the cylinder head and includes a central electrode with a corona tip 36, shown in FIG. 1, extending into the combustion chamber. The energy supply 28 stores the energy and provides the energy to the driver circuit 22 and ultimately to the corona igniter 24. The central electrode receives the energy from the energy supply 28 at a high radio frequency voltage. In one embodiment, the central electrode receives the energy at a level up to 100,000 volts, a current below 5 amperes, and a frequency of 0.5 to 2.0 megahertz. The central electrode then emits a radio frequency electric field into the combustion chamber to ionize a portion of the fuel-air mixture and provide the corona discharge 20 in the combustion chamber. The corona igniter 24 typically includes an insulator 38 surrounding the central electrode, and the insulator 38 and central electrode are received in a metal shell 40, as shown in FIG. 1.

Figure 2:
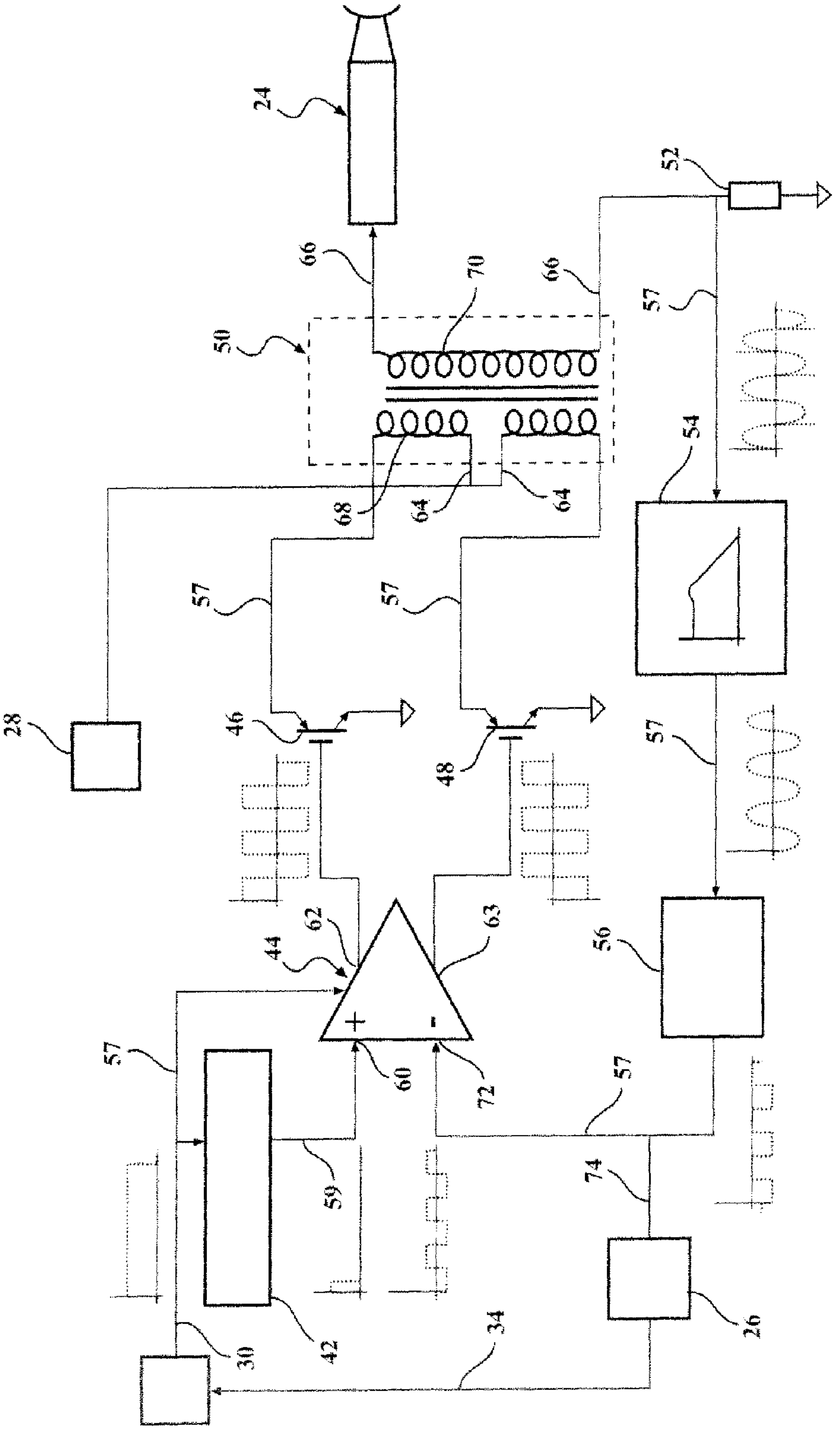
FIG. 2 is another block diagram of a system for detecting an arc formation showing components of a driver circuit according to another embodiment of the invention.

FIG. 2 is a block diagram showing the corona ignition system and components of the driver circuit 22 according to one embodiment of the invention. The corona ignition system is designed so that energy flows through the system at a resonant frequency. The driver circuit 22 includes a trigger circuit 42, a differential amplifier 44, a first switch 46, a second switch 48, a transformer 50, a current sensor 52, a low pass filter 54, and a clamp 56. The energy provided to the driver circuit 22 oscillates at the resonant frequency during operation of the corona ignition system. FIG. 2 shows the energy being transmitted in signals 57 between the components. FIG. 2 also includes a graph of the energy current between each of the components.

A controller 58 of the engine control unit (not show) typically provides the enable signal 30 which turns on the differential amplifier 44. The trigger circuit 42 then initiates the oscillation of frequency and voltage of the energy flowing through the system to and from the corona igniter 24 in response to the enable signal 30. The trigger circuit 42 initiates the oscillation by creating a trigger signal 59 and transmitting the trigger signal 59 to the differential amplifier 44. The system has a period of resonance, and the trigger signal 32 is typically less than half of the period of resonance.

The differential amplifier 44 is activated upon receiving the trigger signal 32. The differential amplifier 44 then receives the energy at a positive input 60, amplifies the energy, and transmits the energy from a first output 62 and a second output 63.

The first switch 46 of the driver circuit 22 is enabled by the first output 62 of the differential amplifier 44, and directs the energy from the energy supply 28 to the corona igniter 24. The switches 46, 48 can be BJT, FET, IGBT, or other suitable types.

The transformer 50 of the driver circuit 22 includes a transformer input 64 for receiving the energy and transformer output 66 for transmitting the energy from the energy supply 28 to the corona igniter 24 and to the current sensor 52. The transformer 50 includes a primary winding 68 and secondary winding 70 transmitting the energy therethrough. The energy from the energy supply 28 first flows through the primary winding 68, which causes the energy to flow through the secondary winding 70. The components of the corona igniter 24 together provide the LC circuit of the system, also referred to as a resonant circuit or tuned circuit. By detection of the resonating current at the current sensor 52, the resonant frequency of the system can be made equal to the resonant frequency of the LC circuit.

The current sensor 52 is typically a resistor and measures the current of energy at the output of the transformer 50 and the corona igniter 24. The current of energy at the output of the transformer 50 is typically equal to the current of energy at the corona igniter 24. The current sensor 52 then transmits the energy to the low pass filter 54. The low pass filter 54 removes unwanted frequencies and provides a phase shift in the current of energy. The phase shift is typically not greater than 180°.

The clamp 56 receives the energy from the low pass filter 54 and performs a signal conditioning on the current of energy. The signal conditioning can include converting the current of energy to a square wave and to a safe voltage. The clamp 56 then transmits the energy back to the negative input 72 of the differential amplifier 44.

The frequency monitor 26 of the corona ignition system obtains the resonant frequency of the energy of the signals 32 traveling through the system. FIGS. 1 and 2 show a frequency signal 74 conveying the resonant frequency from the driver circuit 22 to the frequency monitor 26. The method typically includes obtaining the resonant frequency of the energy by deriving a frequency of oscillation of voltage or current provided to or from the corona igniter 24, and further including converting the frequency of the energy to a square wave.

FIG. 2 shows the frequency monitor 26 located between the clamp 56 and the differential amplifier 44, however it can be disposed in other locations in the system. Further, the frequency monitor 26 is shown in FIGS. 1 and 2 as a separate component, but may be coupled to or integrated in the current sensor 52, or may be integrated with another component of the system. The frequency monitor 26 typically measures the resonant frequency of the energy at the inputs 60, 72 or outputs 62, 63 of the differential amplifier 44. However, the frequency monitor 26 can alternatively measure or obtain the resonant frequency from the energy signals 32 between the energy supply 28 and the transformer 50, between the transformer 50 and the corona igniter 24, between the transformer 50 and the current sensor 52, between the current sensor 52 and the low pass filter 54, and between the low pass filter 54 and the clamp 56. The frequency monitor 26 may also obtain the resonant frequency by other means, for example by measuring current or voltage in a ground return loop (not shown) from the engine or by a magnetic or electrical pickup (not shown) placed close to or suitably selected conductors in the driver circuit 22.

Figure 3:
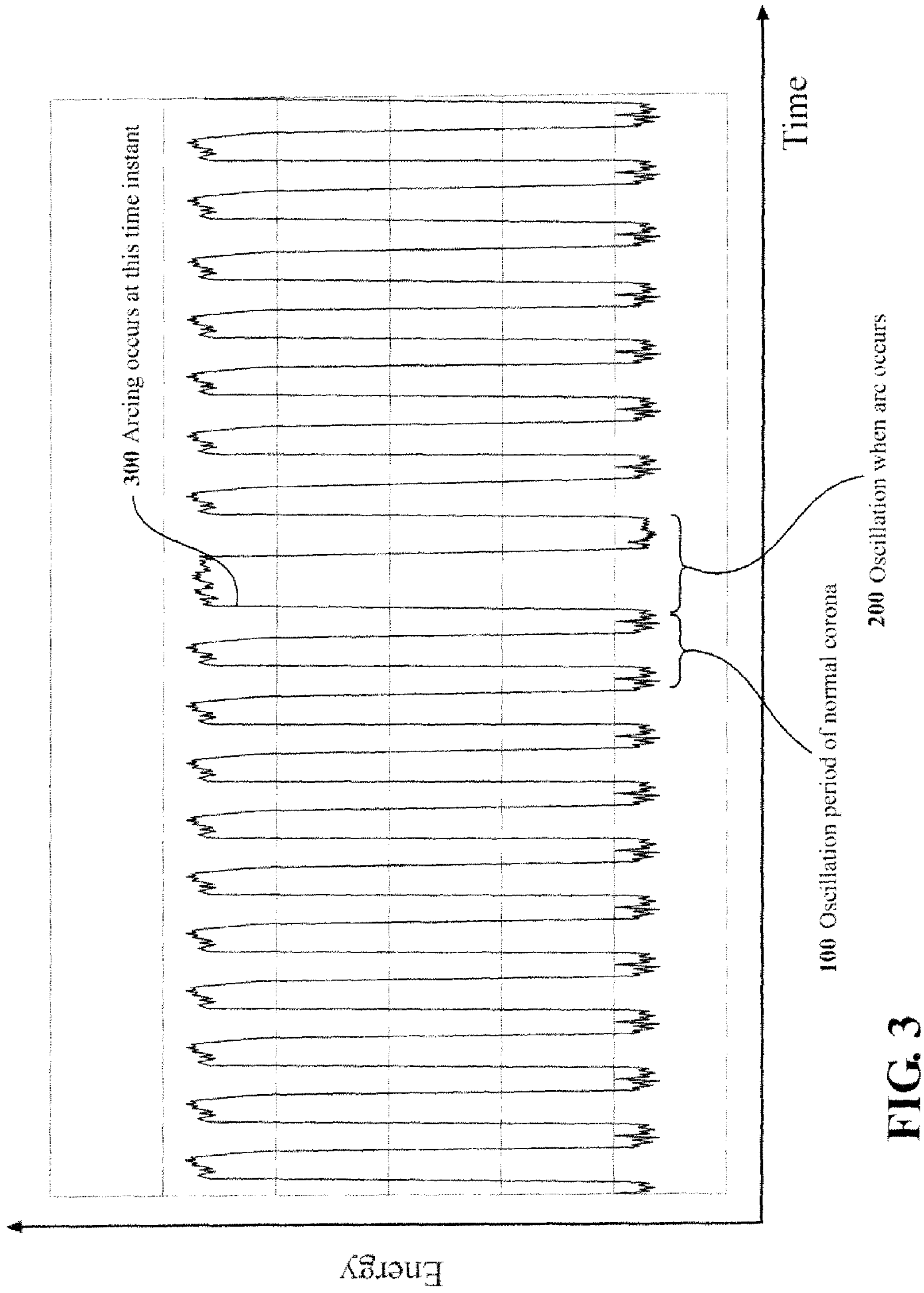
FIG. 3 illustrates an exemplary resonant frequency and oscillation period of energy provided to a corona igniter of the system.

During typically operation of the corona ignition system, the energy transmitted to and from the inputs 60, 72 and outputs 62, 63 of the differential amplifier 44 is at the resonant frequency, also referred to as a frequency of operation. FIG. 3 shows an example of the resonant frequency of the system of FIG. 2 during an ignition event where the driver circuit 22 is already oscillating at time t=0. The resonant frequency is the change in voltage or other parameter of the energy flowing through the driver circuit 22 over a period of time. The resonant frequency is shown as a square wave including a plurality of rising edges and falling edges. The oscillation period of the resonant frequency is equal to the time between two adjacent rising edges, or between two adjacent falling edges. It may be measured by evaluating the interval between two adjacent rising edges, or between two adjacent falling edges, or between an adjacent rising edge and falling edge in any order.

When the corona ignition system is providing the corona discharge 20, the period of oscillation remains fairly consistent for a period of time. The period of oscillation is identified at 100 in FIG. 3. The period of oscillation also remains fairly consistent for a period of time after the onset of arc formation. The periods of oscillation before and after the onset of the arc formation are approximately equal. However, at the onset of the arc formation, when the corona discharge 20 switches to an arc discharge, such as when streamers of the corona discharge 20 reach the cylinder block, metal shell 40, or another grounded component, the variation in the period of oscillation occurs.

The variation in the period of oscillation is at the onset of the arc formation and it occurs only once. The variation is identified at 200 in FIG. 3. The onset of arc formation can be identified at the rising edge of the square wave at the variation, identified at 300 in FIG. 3. The onset of arc formation can also be identified at the falling edge of the square wave at the variation. The variation is a change in the duration of the oscillation period of at least 10%, and typically at least 15%. Further, the oscillation period typically increases by at least 10%. In one example measurement, the oscillation period at 100 is about 1.04 US (965 kHz) and the duration at 200 is about 1.7 US (588 kHz). In another example, the oscillation period of each square wave is 0.5 to 1.5 microseconds while the corona discharge 20 occurs and until the arc formation, for example up to and including the oscillation period at 100. However, in this example, the oscillation period of one of the square waves increases by 0.5 to 1.0 microsecond at the onset of the arc formation, for example at 200.

Immediately after the onset of the arc formation, the oscillation periods of the square waves return to normal and are again approximately equal to the duration at 100, which is the oscillation period before the one varied oscillation period and before the onset of arc formation. The detection of arc formation is identified by the single variation of the resonant frequency, and the detection method is very quick. The variation typically occurs in the first cycle of arcing and is of sufficient magnitude that an electronic detection method can be used. For example, the system can employ resettable timers, phase locked loop, or programmable digital solutions.

Once the variation in the oscillation period is identified by the frequency monitor 26, a feedback signal 34 can be sent to the controller 58 of the engine control unit, so that the engine control unit has the option of responding to the arc formation.

Obviously, many modifications and variations of the present invention are possible in light of the above teachings and may be practiced otherwise than as specifically described while within the scope of the appended claims.

What is claimed is:

1. A method for detecting an arc formation in a corona discharge ignition system, comprising:

supplying energy to a driver circuit oscillating at a resonant frequency and a corona igniter for providing a corona discharge;

obtaining a resonant frequency of the energy in the oscillating driver circuit; and identifying a variation in an oscillation period of the resonant frequency, wherein the resonant frequency includes a first plurality of oscillation periods being successive and each having a duration being approximately equal to one another, the step of identifying a variation in an oscillation period of the resonant frequency includes identifying one oscillation period having an increased duration relative to the first plurality of oscillation periods, the one oscillation period having the increased duration being immediately after the first plurality of successive oscillation periods having approximately equal durations, and the one oscillation period having the increased duration indicating the onset of an arc formation.

2. The method of claim 1 including transmitting a feedback signal to a controller of the system indicating a detection of arc formation upon identifying the variation in the oscillation period.

3. The method of claim 1 wherein the increase in duration of the one oscillation period is an increase of at least 10%.

4. The system of claim 3 wherein the step of identifying the variation in the oscillation period includes identifying the duration increase in only one of the oscillation periods of the resonant frequency.

5. The method of claim 1 wherein the step of obtaining the frequency of the energy occurs at an input or an output of a differential amplifier.

6. The method of claim 1 wherein the step of obtaining the resonant frequency of the energy includes deriving a frequency of oscillation of voltage or current provided to or from the corona igniter, and further including converting the frequency of the energy to a square wave.

7. The method of claim 1, wherein the resonant frequency includes a plurality of rising edges and falling edges, and including the step of identifying the onset of arc formation at the rising edge of the variation.

8. The method of claim 1, wherein the resonant frequency includes a plurality of rising edges and falling edges, and including the step of identifying the onset of arc formation at the falling edge of the variation.

9. The method of claim 1 wherein the resonant frequency includes a second plurality of oscillation periods being successive and each having a duration being approximately equal to one another, and the second plurality of oscillation periods are immediately after the one oscillation period having the increased duration.

10. The method of claim 9 wherein the duration of each of the second plurality of oscillation periods is approximately equal to the duration of each of the first plurality of oscillation periods.

11. A system for detecting an arc formation in a corona discharge ignition system, comprising:

a driver circuit conveying energy oscillating at a resonant frequency;

a corona igniter for receiving the energy and providing a corona discharge; and a frequency monitor for identifying a variation in an oscillation period of the resonant frequency, wherein the variation in the oscillation period indicates the onset of arc formation, wherein the resonant frequency of the energy includes a plurality of oscillation periods, the oscillation periods being 0.5 to 1.5 microseconds and together providing a square wave while corona discharge occurs before the onset of arc formation, one of the oscillation periods increases by 0.5 to 1.0 microsecond at the onset of arc formation, and the duration of the oscillation periods immediately after the one increased oscillation period at the onset of arc formation are the same as the oscillation periods before the onset of arc formation.

12. A system for detecting an arc formation in a corona discharge ignition system, comprising:

a driver circuit conveying energy oscillating at a resonant frequency;

a corona igniter for receiving the energy and providing a corona discharge; and a frequency monitor for identifying a variation in an oscillation period of the resonant frequency, wherein the variation in the oscillation period indicates the onset of arc formation, wherein the resonant frequency includes a first plurality of oscillation periods being successive and each having a duration being approximately equal to one another, the frequency monitor identifies the variation in an oscillation period of the resonant frequency by identifying one oscillation period having an increased duration relative to the first plurality of oscillation periods, the one oscillation period having the increased duration being immediately after the first plurality of successive oscillation periods having approximately equal durations, and the one oscillation period having the increased duration indicates the onset of an arc formation.

13. The system of claim 12 wherein the duration of the oscillation period increases by less than 10% when the corona igniter provides the corona discharge and the duration of the oscillation period increases by at least 10% at the onset of arc formation.

14. The system of claim 13 wherein the duration of the oscillation period increases by at least 15% at the onset of arc formation.

15. The system of claim 12 wherein the frequency monitor transmits a feedback signal to a controller indicating the onset of arc formation upon identifying the variation in the oscillation period.

16. The system of claim 12 wherein the driver circuit includes an energy supply for supplying energy to the driver circuit and the corona igniter, a differential amplifier for receiving the energy at an input and transmitting the energy from an output, a switch enabled by an output of the differential amplifier for directing the current of the energy from the energy supply to the corona igniter; and wherein the frequency monitor identifies the variation in oscillation period from the energy at the input, or the output.

17. The system of claim 12 wherein the resonant frequency includes a second plurality of oscillation periods being successive and each having a duration being approximately equal to one another, and the second plurality of oscillation periods are immediately after the one oscillation period having the increased duration.

18. The system of claim 17 wherein the duration of each of the second plurality of oscillation periods is approximately equal to the duration of each of the first plurality of oscillation periods.

* * * * *